United States Patent [19]
Hannum

[11] Patent Number: 6,163,473
[45] Date of Patent: Dec. 19, 2000

[54] MEMORY FOR STORING ENCODED MASK AND DATA BITS

[75] Inventor: David P Hannum, Fort Collins, Colo.

[73] Assignee: Hewlett-Packard Company, Palo Alto, Calif.

[21] Appl. No.: 09/496,854

[22] Filed: Feb. 2, 2000

[51] Int. Cl.[7] .................................................. G11C 15/00
[52] U.S. Cl. .......................................... 365/49; 365/230.5
[58] Field of Search ................................. 365/49, 189.07, 365/189.04, 230.05

[56] References Cited

U.S. PATENT DOCUMENTS

| 5,226,005 | 7/1993 | Lee et al. | 365/49 |
| 5,646,878 | 7/1997 | Samra | 365/49 |
| 5,940,852 | 8/1999 | Rangasayee et al. | 365/49 |
| 6,046,942 | 4/2000 | Hwang et al. | 365/189.05 |

Primary Examiner—Son Mai

[57] ABSTRACT

A content addressable memory (CAM) has a matrix of dual port memory cells each storing two encoded bits resulting from a data bit being combined with a mask bit. The encoded bits have differing values representing the data bit value when the cell is not masked and the same values when the cell is masked. During a CAM look-up operation when the encoded bits indicate the cell is not masked, a matching circuit of the cell compares the encoded bits and a reference bit so an output of the matching circuit indicates whether the data bit which resulted in the stored encoded bits is the same as the reference bit. When the cell is read by an address word and the encoded bits indicate the cell is not masked, the cell drives a read port with a level indicative of the data bit which resulted in the encoded bits. When the encoded bits indicate the cell is masked, the outputs of matching circuit and the read port are static.

26 Claims, 4 Drawing Sheets

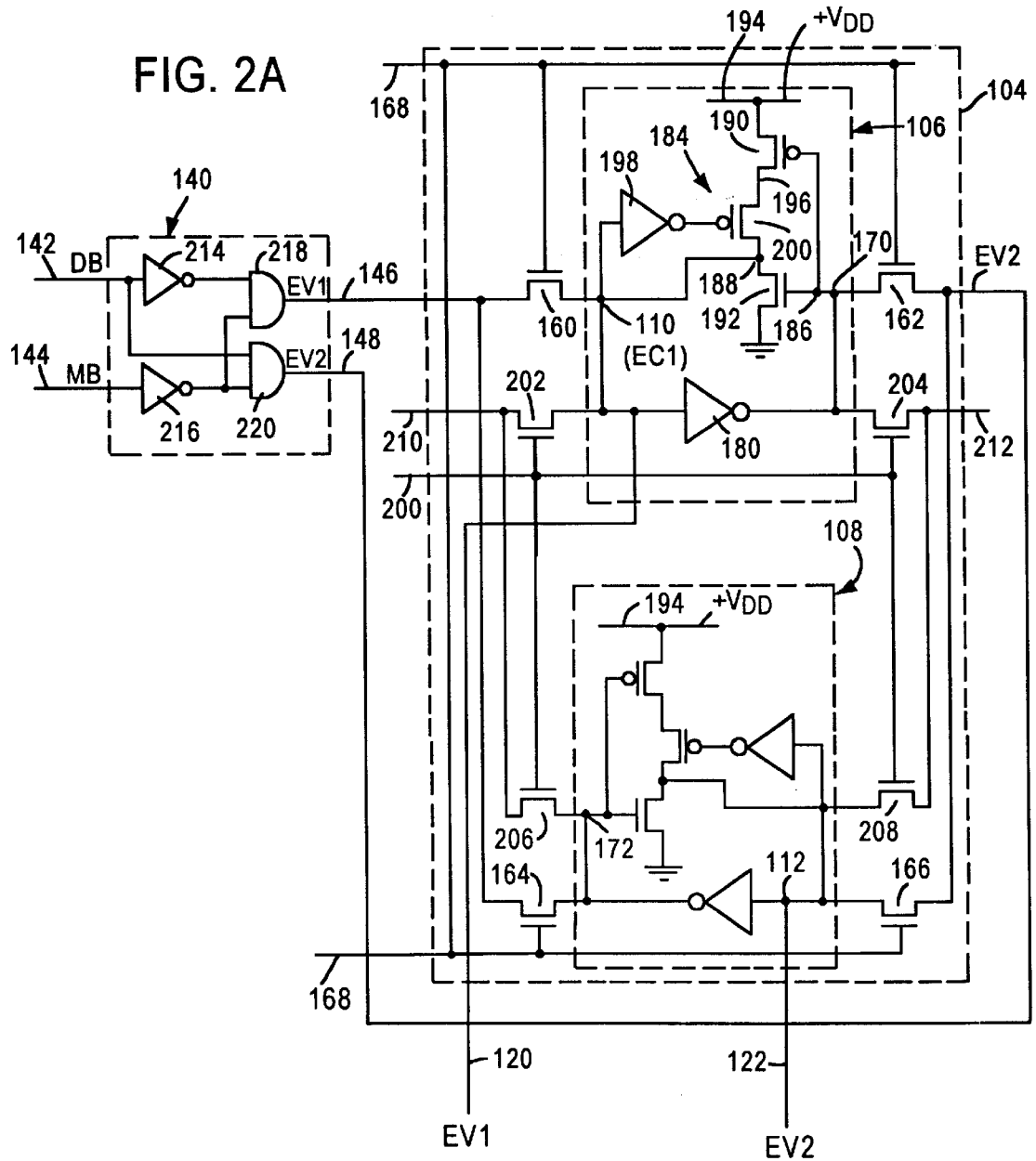

MEMORY FOR STORING ENCODED MASK AND DATA BITS

FIELD OF THE INVENTION

The present invention relates generally to memories and, more particularly, to a memory including a cell for storing encoded bits resulting from a mask bit being combined with a data bit.

BACKGROUND OF THE INVENTION

A typical semiconductor memory comprises an array of memory cells on an integrated circuit (IC) chip. The memory cells of a typical memory array are in a matrix of rows and columns, with each row including multiple cells, one in each column; one cell in each row is for each bit of a word stored in the row. It is often desirable to selectively mask one or more of the memory cells to prevent the masked cells from being read.

Reading conventional addressable memory cells is by cell addresses, while content addressable word memory (CAM) cells are read by comparing cell contents with a reference bit. CAM cells are of the single and dual port type; dual port CAM cells increase the flexibility of memories including CAM cells.

FIG. 1 is a circuit diagram of a known dual port CAM cell 10 including a masking arrangement in a static random access memory (SRAM) array. CAM cell 10 includes SRAM storage cell 12 which stores a single data bit at a time, but which can respond at different times to two data bit sources IN1 and IN2. Dual port CAM cell 10 also includes two write ports 32, 34, two read ports 36, 38, two matching (i.e., comparing) circuits 40, 42 responsive at different times to reference bits CN01 and CN02, and two match output lines 68, 69 respectively driven by circuits 40, 42.

Cell 10 can be used as a conventional memory cell or as a CAM cell. When cell 10 is used as a conventional memory cell and is not masked, ports 36, 38 derive levels indicative of the value of the bit that cell 10 stores. When cell 10 is used as a CAM cell and is not masked, lines 68, 69 derive levels indicative of whether the value of the bit cell 10 stores is the same or differs from a reference bit applied to the cell. When cell 10 is masked, cell 10 does not supply any signals to ports 36, 38 and lines 68, 69, so voltage levels at these ports and lines are static.

Cell 12 includes a first data storage node 14 and a second data storage node 16 for normally storing complementary data values, e.g., node 14 stores a logic high INH1 and node 16 stores a logic low INL1 in response to IN1 having a high value. Cell 12 includes a first inverter 17 formed by a pair of complementary field effect transistors (FETs) 18, 20 and a second inverter 21 formed by a pair of complementary FETs 22, 24. The complementary FETS of each of inverters 17 and 21 have (1) series connected source drain paths connected between a DC power supply voltage, $+V_{DD}$ and ground, (2) gate electrodes that are driven in parallel by a bi-level input signal, and (3) drain electrodes tied to a common terminal that is the inverter output. The first and second inverters 17 and 21 have cross-coupled inputs and outputs to thereby form a latch in a known manner. The input of inverter 17 and output of inverter 21 are tied to storage node 14, while the output of inverter 17 and the input of inverter 21 are tied to storage node 16.

Storage nodes 14, 16 of cell 12 are respectively connected via first and second data lines 28 and 30 to input terminals of ports 32–38 and matching circuits 40, 42. Write ports 32 and 34 include pass gate N-channel FETs. Write port 32 is responsive during a first write operation to the complementary binary data values INH1 and INL1 and write port 34 is responsive to complementary binary data values INH2 and INL2. The first and second write operations occur at different times. Read ports 36 and 38 respectively respond during different read operations to high voltage values of dump pulses, DUMP 1 and DUMP 2, which are derived at different times. Read ports 36 and 38 supply complementary binary values on lines 28 and 30 to complementary output leads OUTL1 and OUTH1 when a pulse DUMP1 is derived and to complementary output leads OUTL2 and OUTH2 when a pulse DUMP2 is derived.

Matching circuit 40 responds to complementary binary reference bits CNOL1 and CLOH1, indicative of a bit whose value is selectively compared with the value of the bit stored in cell 12; bits CNOL1 and CNOH1 are applied to lines 64 and 66 and are derived by circuitry (not shown) in response to CNO1. When cell 10 is not masked (i.e., is unmasked), matching circuit 40 compares the bit value stored in cell 12 with the value of the reference bits CNOL1 and CNOH1 bits to signal if the stored and reference bits have the same value. Matching circuit 42 performs the same operations as circuit 40, but responds to complementary reference bits CNOL2 and CNOH2. The comparing operations matching circuits 40 and 42 perform provide cell 10 with the CAM capability.

CAM cell 10 also includes a latch 44 including inverters 47 and 49 having the same elements, connections and back-to-back arrangement as inverters 17 and 21. Latch 44 latches one of mask bits, MASK1 or MASK2. The mask bits have binary one and zero values for respectively masking and unmasking cell 10. A first mask bit write port 50 and a second write bit mask port 52 respectively respond to MASK1 and MASK2 to write the mask bit value into latch 44. Mask bit MASK1 is represented by complementary bits, MASKH1 and MASKL1. Bits MASK1 and MASK2 are coupled to the latch 44 when SET1 is high, while MASKH2 and MASKL2 are coupled to latch 44 when SET2 is high.

Control line 54 responds to the mask bit voltage value stored at node 45 to control masking of cell 12. Line 54 applies the mask control voltage associated with the stored mask bit in parallel to the gate electrodes of masking control FETs 56, 58 and 60 of cell 12, to control the mask and unmask operations of cell 10. FET 56 has a source drain path between power supply terminal $+V_{DD}$ and the source drain paths of FETs 18 and 20 of inverter 17 and the source drain paths of FETs 22 and 24 of inverter 21. The source drain paths of FETs 58 and 60 respectively sink the source drain paths of FETs 18 and 20.

In response to the mask bit at node 45 and on line 54 having a logic low (i.e., logic "0" as represented by the ground voltage of the chip DC power supply), CAM cell 10 is unmasked by the low voltage that line 54 applies to the gates of FETs 56, 58 and 60. The low voltage level carried by control line 54 turns on P-channel FET 56 and turns off N-channel FETs 58 and 60, to thereby configure cell 12 for normal, unmasked operation, enabling cell 12 to supply complementary data values (e.g., a logic low "0" and a logic high "1") to storage nodes 14 and 16. That is, while the mask bit at node 45 is a logic low, cell 12 operates as a standard, cross-coupled inverter latch responsive to the $+V_{DD}$ power supply voltage at the source of FET 56, as if FETs 58 and 60 were not included in the circuit.

During an unmasked CAM look-up operation, one of matching circuits 40 or 42 compares the bit values associated with the complementary bits stored in cell 12 to complementary reference bit values CNOL1 and CNOH1 or CNOL2 and CNOH2. If matching circuit 40 detects a match between the bits on data bit lines 28 and 30 and reference bit lines 64 and 66, a high voltage supplied by circuitry (not shown) to match line 68 is maintained and the MAT1 output of matching circuit 40 has a high value. If matching circuit 40 detects a mismatch between the reference and stored data bits, a low impedance of the matching circuit d(Lischarges the high voltage on line 68 and MAT1 has a low value.

Match line 68 is discharged through (1) a first pair of N-type FETs 70, 72 having series connected source drain paths between match line 68 and the CAM ground rail, or (2) a second pair of similarly configured FETs 74, 76. Matching circuit 40 is arranged such that if the above-mentioned mismatch occurs, FETs 70, 72 are turned on simultaneously by high voltage levels respectively applied to the gate electrodes thereof via reference data line 64 and first data line 28. Matching circuit 42 responds in a similar manner to the bits on leads 28 and 30, as well as CNOL2 and CNOH2 to control the MAT2 voltage.

In contrast, while the stored mask bit at node 45 and on line 54 is a logic high (i.e., logic "1"), the matching operation of CAM cell 10 is masked to prevent discharge of MAT1 and MAT2 during a CAM look-up operation, even if there is a mismatch between reference bits CNOL1 and CNOH1 or CNOL2 and CNOH2 and the data bit that inverters 17 and 21 store. During masking, the high voltage level on control line 54 turns off P-channel FET 56, and turns on N-chainel FETs 58 and 60. The +$V_{DD}$ power supply voltage is removed from the FETs of inverters 17 and 21 and the source drain paths of FETs 58 and 60 respectively apply low impedances across the source drain paths of FETs 18 and 22 of inverters 17 and 21. Consequently, the source drain paths of FETs 58 and 60 apply the ground voltages at the source electrodes of these FETs to both nodes 14 and 16. The low voltage levels at storage nodes 14 and 16 thus no longer represent the data bit previously stored in cell 12.

The low levels at nodes 14 and 16 respectively drive the gate electrodes of N-channel FETs 72 and 74 to keep these FETs turned OFF. Because FETs 72, 74, are OFF, neither first FET pair 70, 72 nor second FET pair 70, 76 can discharge MAT1 or MAT2 to a low voltage, regardless of the reference data levels lines 64 and 68 respectively apply to the gates of FETs 70 and 76 of circuit 40 or the corresponding gates of circuit 42.

The flexibility offered by the dual port configuration of CAM cell 10 is seriously undermined by the disadvantages associated with requiring two write ports 32 and 34 and two mask ports 50 and 52. Mask ports 50, 52 respectively include a pair of mask bit input lines 80, 82 and 84, 86, which carry complementary values to mask bit latch 44. These four extra mask bit lines associated with selectively masking CAM cell 10 constitute approximately 25% of (1) the total number of data lines coupled with cell 10 and (2) the total amount of metal required for the cell data lines. Bit lines 80, 82, 84 and 86 also occupy a substantial fraction, nearly 25%, of the foot-print or overall area that cell 10 occupies on an integrated circuit chip.

The large fraction of metal and area resources taken up by the mask bit lines 80, 82, 84 and 86 seriously limits (1) the CAM array cell density, and (2) the metal pitch or width of the data lines connected to each array cell because the total number of data lines coupled to cell 10 is a dominant factor in determining the pitch of the data lines. Such limitations are especially acute in the dual port CAM of FIG. 1, relative to a single port CAM, because of the high total number of metal data lines used for accessing the dual port CAM cells.

Limiting the pitch of or narrowing the metal data lines on the integrated circuit disadvantageously increases the resistance and resulting resistance-capacitance (RC) time constants of such metal lines. Limiting the CAM cell array density causes individual CAM cells to be farther from each other in the array, to increase the length of interconnecting metal data lines which, in tunr, increases metal data line resistance and RC time constants. Such increases in data line RC time constants of the CAM cell array disadvantageously limit the operating frequency of the CAM cell array.

In summary, there is a need to reduce the total number of data lines coupled with each dual port CAM cell in a CAM cell array without reducing the capabilities of the dual port CAM cell to thereby increase CAM cell array density and operating frequency.

SUMMARY OF THE INVENTION

It is accordingly an object of the present invention to provide a new and improved maskable memory.

An additional object of the innovation is to provide a new and improved high density, high speed, maskable semiconductor memory.

Another object of the invention is to provide a new and improved dual CAM cell and CAM cell array having an increased density.

Another object of the present invention is to provide a new and improved dual port, maskable CAM cell and CAM cell array having a reduced total number of input lines.

In accordance with one aspect of the invention, a memory adapted to be responsive to mask and data bit sources comprises a plurality of selectively maskable memory cells and circuitry for combining the mask and data bits to derive plural encoded bits. The encoded bits have values such that (i) a first combination of the plural encoded bits indicates a first data value and that a cell for storing the encoded bits is not to be masked, (ii) a second combination of the plural encoded bits indicates a second data value and that a cell for storing the encoded bits is not to be masked, and (iii) a third combination of the plural encoded bits indicates a cell for storing the encoded bits is to be masked. Each of the selectively maskable memory cells is responsive to and stores the plural encoded bits associated with that cell, as derived by the combining circuitry. Each of the maskable cells includes output circuitry responsive to the combination of bits stored in the cell for (a) performing readout associated with the first and second combination of values, and (b) preventing readout of the cell in response to the third combination of values.

Preferably, at least some of the maskable memory cells are content addressable cells, each including a matching circuit connected to be responsive to the combination of bits stored in the cell and a reference bit. The matching circuit compares the reference bit with the bits stored in the cell while the first and second combination of bits is stored in the cell. The results of the comparison drive the output circuitry of the cell.

In addition, at least some of the memory cells include cicuitry for reading the contents of the cell. The circuitry for reading the contents of the cell is arranged so that (a) any cell storing the first combination of values supplies the output circuitry with the first data value, (b) any cells storing the second combination of values supplies the output circuitry with the second value, and (c) any cell storing the third combination of values supplies no data value to the output circuitry.

In a preferred embodiment, each of the combinations includes first and second encoded bits, and each of the cells has circuitry having three stable storage states for storing the first, second and third combinations of the first and second encoded bits. The circuitry having three stable states preferably includes first and second latches, each having first and second storage nodes. The first and second storage nodes of the first latch are respectively responsive to the first and second encoded bits during a write operation of the cell. The first and second nodes of the second latch are respectively responsive to the second and first encoded bits during the write operation. Each of the latches includes substantially identical circuitry including (a) first and second inverters selectively connected in a regenerative back-to-back relation between the first and second nodes, and (b) a control circuit responsive to the bit at one of the nodes for controlling the connections of the inverters to each other.

In the preferred embodiment, at least some of the cells are dual port CAM cells, each including (a) a pair of latches having first and second storage nodes connected to drive first and second storage lines with three combinations of bi-level voltages commensurate with the values of the encoded bits stored in the cell, (b) first and second read circuits respectively connected to first and second read lines and both connected to the first and second storage lines., and (c) first and second match circuits respectively connected to first and second complementary reference lines and both connected to the first and second storage lines.

Another aspect of the invention relates to a method of operating a memory including memory cells, which method comprises combining a data bit and a mask bit to derive plural encoded bits having combinations of values such that the plural encoded bits have (a) a first combination of values when a cell of the memory is to store a data bit having a first value, (b) a second combination of values when the cell is to store a data bit having the second value, and (c) a third combination of values when the cell is to be masked. The encoded bits are stored in one of the cells at different times. The encoded bits stored in the one cell are selectively coupled to readout circuitry of the memory so that the readout circuitry responds to the first and second combinations of stored bits and is unresponsive to the third combination of stored bits.

The method can be performed with a CAM cell responsive to a reference bit, in which case the values of the stored first and second combinations of bits are compared with the reference bit. The comparing step causes the readout circuitry to derive first and second output levels in response to the reference bit and the data bit which was encoded being respectively different and the same. In the preferred embodiment, the first level differs from a level the readout circuitry usually derives, but the second level is the same as the level the readout circuitry usually derives. The third stored combination of bits causes the readout circuitry to derive the second level.

The method can also be performed by applying a read address input to the cell, in which case the cell responds to the read address input to cause the cell to supply the stored bits in the cell to the readout circuitry so that the readout circuitry derives (a) first and second levels that respectively are the same as the levels of the data bit which resulted in the encoded bits stored in the cell when the cell stores the first and second combinations of bit values, and (b) the second level when the cell stores the third combination of bit values.

The above and still further other objects, features and advantages of the present invention will become apparent upon consideration of the following detailed description of a specific embodiment thereof, especially when taken in conjunction with the accompanying drawings.

BRIEF DESCRIPTION OF THE DRAWING

As described.

FIG. 2, including FIGS. 2A and 2B, is a circuit diagram of a preferred embodiment of a dual port maskable CAM cell in accordance with a preferred embodiment of the present invention.

DETAILED DESCRIPTION OF THE DRAWING

Figure 1:
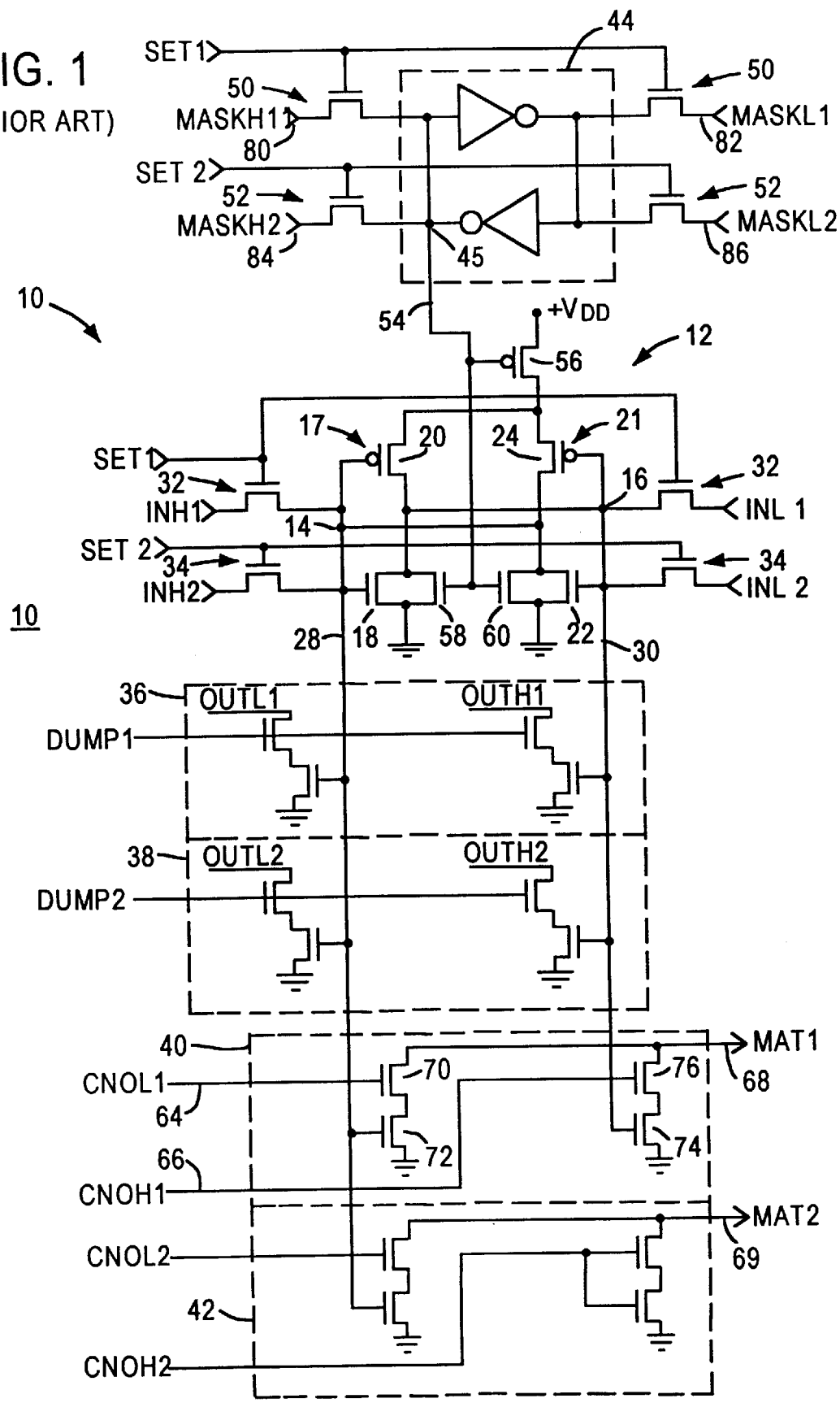
FIG. 1 is a circuit diagram of a prior art dual port maskable CAM cell.
Figure 2B:
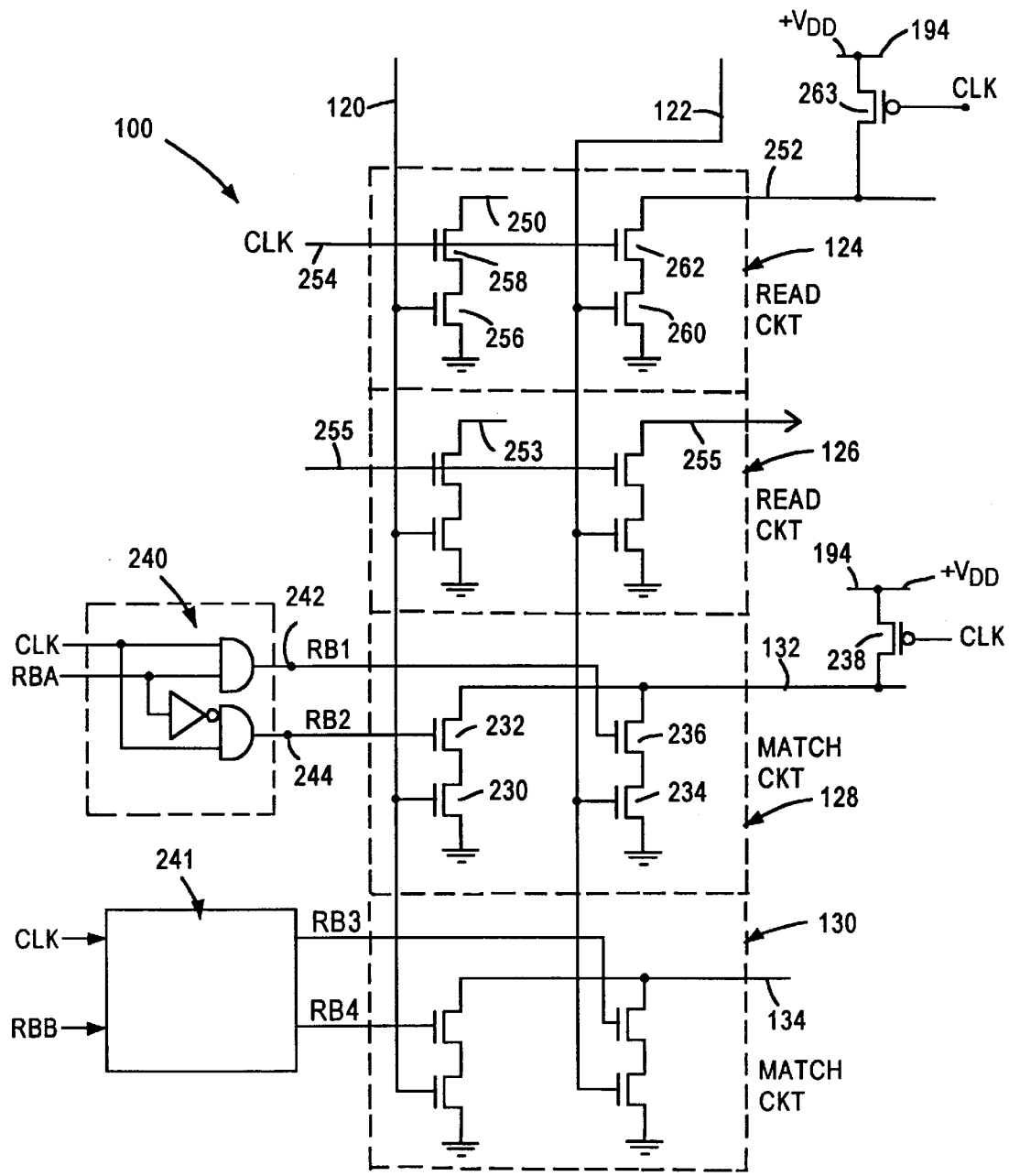

FIG. 2 is a circuit diagram of dual port CAM cell 100 on an integrated circuit including many dual port CAM cells identical to the cell of FIG. 2. Cell 100 is similar to cell 10 because both include two lines tied to a pair of storage nodes, two read circuits and two matching or comparison circuits. Cell 100, however, does not include a match latch similar to latch 44, but is responsive to a pair of encoded bits resulting from the combination of a mask bit and a data bit for the cell. Another difference between cells 10 and 100 is that the latch of cell 100 can respond to and store three different combinations of the encoded bits. Cell 100 is selectively masked by the encoded bits to eliminate the requirement of FIG. 1 for separate mask bit write ports 50 and 52 and the associated mask bit data lines 80, 82, 84 and 86. As a result, dual port CAM cell 100 can be incorporated into higher density CAM arrays, and the pitch of the data lines coupled to dual port CAM cell 100 can be increased, relative to the prior art diual port CAM cell 10 of FIG. 1.

Mask bit MB for selectively masking and unmasking cell 100 is combined in encoder 140 with data bit DB to derive a pair of encoded bits EV1 and EV2 that are written to cell 100 via a write port of cell 100. One encoder is provided for each column of the matrix including cell 100. The output of the encoder is applied to cells in different rows of the matrix at different times when the write lines are enabled. Cell 100 stores encoded bits EV1 and EV2 and responds to the other inputs of the cell to (1) indicate a match between the data bit which resulted in the encoded bit and an input reference bit, (2) indicate the value of the data bit DB stored in cell 100, or (3) perform a masking operation. Such combining of the mask bit MB with data bit DB and writing of the encoded bits EV1 and EV2 to cell 100 eliminates the need for the separate mask bit ports 80, 82, 84 and 86 of FIG. 1 and the lines associated therewith.

With reference to FIG. 2, dual port CAM cell 100 includes an SRAM memory cell 104 configured to store a pair of bits. Low and high logic levels of the binary bits of cell 100 respectively correspond to voltage levels near ground and near a DC power supply line voltage ($+V_{DD}$ for the integrated circuit chip including the cell); $+V_{DD}$ is approximately 1.3 volts. A first pail of bits at a first port including lines 146 and 148 is written into and stored in cell 100 during a first interval while a high voltage level is applied to word line 168. A second pair of bits at a second port including lines 210 and 212 is written into and stored in cell 100 during a second interval while a high voltage level is applied to line 200. Encoded bits EV1 and EV2 are on lines 146 and 148. The bits on lines 210 and 212 can be a combination of a different data bit and a mask bit or two complementary values of a single data bit.

While the following description deals primarily with how cell 100 responds to the values of EV1 and EV2 on lines 146 and 148, it is to be understood that the cell responds in the same way to similar encoded bits on lines 210 and 212. If the bits on lines 210 and 212 are not encoded, but are complementary data bits, cell 100 flnctions substantially the same as the prior art cell 10 of FIG. 1 when cell 10 is not masked.

Cell 100 includes dual read circuits 124 and 126 which are the same as dual read circuits 36 and 38 of prior art cell 10. Read circuits 124 and 126 respectively respond to positive "dump" voltage pulses applied at different times to lines 254 and 255 to provide read out to lines 250, 252 and 253, 254 of the two binary values cell 100 stores. Hence, during reading of port 124, lines 250, 252 indicate the value cell 100 stores and during reading of port 126, lines 253, 255 indicate the value cell 100 stores.

Cell 100 also includes dual match (i.e., comparison) circuits 128 and 130, which are the same as dual match circuits 40 and 42 of cell 10. Match circuits 128 and 130 respectively respond to complementary reference bits RB1, RB2 and RB3, RB4 that circuits 240 and 241 respectively derive at different times in response to input bits RBA and RBB. Circuit 128 or 130 responds to RB1, RB2 or RB3, RB4, as appropriate, to compare the two bits that cell 100 stores with the reference bits. When the bits stored in cell 100 are the same as the reference bits RB1 and RB2 because cell 100 is not masked and cell 100 stores an indication of data bit DB differing from RBA, the precharged high voltage ($+V_{DD}$) on line 132 is reduced substantially to zero. When the bits stored in cell 100 differ from the reference bit RBA because cell 100 is masked or because cell 100 stores an indication of DB not being masked and DB being the same as RBA, the precharge voltage $+V_{DD}$ remains on line 132. Match circuit 130 responds at a different time to the RB3, RB4 outputs of circuit 241 and the bits cell 100 stores to drive line 134 in the same way matching circuit 128 drives line 132.

To store the bits on lines 146 and 148 or on lines 210 and 212, cell 104 includes a first memory, i.e., latch circuit 106 and a second memory, i.e., latch circuit 108. Latch circuits 106 and 108 respectively include first and second storage nodes 110 and 112 respectively tied to data lines 120 amd 122. Each of latches 106 and 108 is a tri-state storage device that can store (1) two complementary bit values (i.e., a one and a zero or a zero and a one) or (2) two zero values. Because latches 106 and 108 are the same, the description is generally confined to latch 106.

Cell 100 is selectively masked and umnnasked in response to encoded bits EV1 and EV2 stored at nodes 110 and 112. The bits stored at storage nodes 110 and 112 are respectively coupled via first and second data lines 120 and 122 as inputs to: (1) read circuits 124 and 126, and (2) matching circuits 128 and 130 for comparing a data bit represented by encoded values EV1 and EV2 with complementary reference data bits RB1, RB2 and RB3, RB4. Circuit 240 responds to reference bit RBA and a clock wave to derive RB1, RB2 at terminals 242, 244, respectively, while circuit 241 responds to reference bit RBB and the clock wave to derive RB3, RB4. The bits at terminals 242 and 244 are supplied to matching circuit 128.

Encoder 140 combines data bit DB that a suitable source (not shown) supplies to line 142 with mask bit MB that a suitable source (not shown) supplies to line 144; MB=1 signifies a mask operation, and MB=0 signifies that there is no mask operation. Encoder 140 combines DB and MB to derive encoded bits EV1 and EV2 on lines 146 and 148 in accordance with the following truth table:

TABLE I

| data bit DB | mask bit MB | EV1 | EV2 |
|---|---|---|---|
| 0 | 0 | 1 | 0 |
| 1 | 0 | 0 | 1 |
| 0 or 1 | 1 | 0 | 0 |

Table I represents the Boolean relationships $EV1 = (\overline{MB})(\overline{DB})$ $EV2 = (\overline{MB})(DB)$ To these ends, encoder 140 includes inverters 216 and 214, as well as AND gates 218 and 220. Inverters 216 and 214 respectively respond to the DB and MB signals on lines 142 and 144 and each of gates 218 and 220 has one input terminal responsive to the inverted replica of MB that inverter 216 derives. The remaining input terminals of gates 220 and 218 respectively respond to the DB signal on line 142 and an inverted replica thereof which inverter 214 derives. Gates 218 and 220 respectively derive EV1 and EV2 in accordance with Table I since the inverted replica of MB which inverter 216 derives when MB=1 causes low voltage, binary zero EV1 and EV2 outputs of gates 218 and 220. When MB=0, the EV1 output of gate 218 responds to the output of inverter 214 to derive a value which is the one's complement of DB (i.e., is inverted with respect to DB), and the EV2 output of gate 220 responds directly to DB to have the same value as DB. Of course, any other suitable logic circuitry can be used to derive the values of EV1 and EV2 and encoding need not necessarily be in accordance with Table I.

The value of mask bit MB controls the selective masking and unmasking of CAM cell 100 indirectly through encoded values EV1 and EV2 stored in cell 104. If MB has a low (0) logic level, cell 100 is not masked and operates so EV1 and EV2 are respectively the complement of data bit DB and the same as DB. In response to MB=0, one of matching circuits 128 or 130 can discharge its associated match lines 132 and 134 during a CAM look up. Lines 132 and 134 are discharged if the value of the binary data bit DB which caused latches 106 and 108 to be set is the same as reference bits RBA and RBB respectively applied to circuits 240 and 241 at different times. If DB=RBA, line 132 stays high; if DB=RBB, line 134 stays high.

Conversely, a high logic value of mask bit MB masks CAM cell 100 whereby matching circuits 128, 130 are prevented from discharging associated match lines 132, 134 during a CAM look up operation, even if DB differs from RBA and RBB. While mask bit MB is a logic "1", encoder 140 supplies low logic values EV1 and EV2 to storage nodes 110 and 112, respectively. The resulting low voltages stored at nodes 110 and 112 are coupled by data lines 120 and 122 to matching circuits 128, 130 whereby the low voltages prevent discharging of associated match lines 128, 130.

From the above description, memory cell 104 stores three different value states of encoded values EV1, EV2, namely, states (0,1), (1,0) and (0,0). Thus, the two binary values at nodes 110 and 112 and on lines 120 and 122 can have three different combinations of values. In contrast, prior art memory cells typically only store two value combinations, namely, states (1,0) and (0,1). Cell 100 thus obviates the need for an additional prior art mask write bit port and associated mask data lines because the function of such a ports is embedded in the third encoded (0,0) value state.

Memory cell 104 is now described in detail. Memory cell 104 includes first and second latch circuits 106 and 108 for respectively latching encoded bits EV1 and EV2. Latch circuits 106 and 108 have mirror image circuit configurations, hence a detailed description of latch 106 suffices for latch 108. Write access to latches 106, 108 is provided via the fist write port of memory cell 104 including first and second pairs of N-channel pass gate FETs 160, 162 and 164, 166, and a word line 168 connected to the gate electrodes of each of FETs 160, 162, 164 and 166.

Pass gate FETs 160, 162 have source drain paths respectively connected between (1) line 146 that carries EV1 and memory cell node 110 where EV1 is stored, and (2) line 148 that carries EV2 and a "hidden" node 170 of latch 106. Similarly, FETs 164, 166 have source-drain paths respectively connected between line 146 and a "hidden" node 172 of latch 108 and (2) line 148 and memory cell node 112 where EV2 is stored.

To write the encoded values EV1, EV2 to respective nodes 110, 112, the voltage on word line 168 is pulsed high during a write cycle of CAM cell 100, thereby respectively connecting lines 146 and 148 with nodes 110 and 112 through pass gates 160 and 166. Latches 106 and 108 respectively latch the values EV1 and EV2 applied to nodes 110 and 112.

Latch 106 includes a first inverter 180 having an input and an output respectively tied to nodes 110 and 170, to thereby invert a logic level at node 110 and apply the inverted level to node 170. Latch 106 also includes a selectively enabled-inverter circuit 184 cross-coupled with inverter 180. Inverter 184 includes an input node 186 and an output node 188 respectively tied to nodes 170 and 110. Inverter 184, when enabled, selectively inverts a logic level at node 170 and applies the inverted level to node 110.

Inverter 184 is selectively enabled and disabled by the voltage at node 110 (i.e., by bit EV1). Inverter 184 is enabled to operate as a normal inverter in response to a high logic level being at node 110 (i.e., while EV1="1"), whereby inverter 180 and inverter 184 form a normal, cross-coupled inverter latch. On the other hand, inverter 184 is disabled in response to a low logic level being at node 110 (i.e., while EV1="0"), whereby the inverting function of inverter 184 is effectively decoupled from latch 106. Inverter 184 is controlled in this manier to prevent the occurrence of indeterminate voltages (i.e., voltages approximately equal to one-half the power supply voltage $+V_{DD}$) at node 110 while pass gate FETs 160, 162 are closed. Latch 108 is similarly configured to prevent the occurrence of indeterminate voltages at node 112 when pass gate FETs 164, 166 are closed.

Inverter 184 includes P-channel FETs 190 and 200 and N-channel FET 192 having source drain paths series connected between $+V_{DD}$ and ground. The voltage at node 170 drives the gate electrodes of FETs 190 and 192 in parallel so that FETs 190 and 192 have complementary on and off states. Inverter 198, responsive to the voltage at node 110, drives the gate electrode of P-channel FET 200.

Since latches 106 and 108 have circuit configurations that are mirror images of each other as viewed from left-to-right in FIG. 2, from an operational viewpoint nodes 110 and 170 of latch 106 respectively correspond to nodes 112 and 172 of latch 108.

The operation of latch 106 during a write cycle to CAM cell 104 is now described. Assume first that logic values "1" and "0" for EV1 and EV2 are concurrently written from encoder 140 to memory cell 104 via the first write port, including FETs 160, 162, 164 and l66. Pulsing word line 168 high during a write cycle of cell 104 causes the source drain paths of pass gate FETs 160–166 to turn ON to cause application of a logic "1" (EV1) high voltage on lead 146 to nodes 110 and 172 of latches 106 and 108 and a logic "0" (EV2) low voltage on lead 148 to nodes 112 and 170 of latches 108 and 166. The logic "1" at node 110 enables the inverting operation of inverter 184, whereby cross-coupled inverters 184 and 180 latch the logic values EV1 and EV2=0 respectively applied to nodes 110 and 170. The logic values EV2=0 and EV1=1 are respectively latched at nodes 112 and 172 of latch 108. Operation of latch 108 in response to EV2=0 and EV1=1 is the same as operation of latch 106 in response to EV1=0 and EV2=1. This operation of latch 106 is described infra. The voltages on lines 120 and 122 remain at the high and low values at nodes 110 and 112, to which the lines are tied, after the pass gates formed by FETs 160–168 turn off in response to a low voltage on line 168 because of the regenerative feedback connections of inverters 180 and 184 to nodes 110 and 170.

Assume next that logic values "0" and "1" for EV1 and EV2 are concurrently written to and stored by memory cell 104. Pulsing word line 168 high opens pass gate FET 160 so the EV1=0 on line 146 is applied to node 110 thus disabling the inverting operation of inverter 184. Concurrently, the EV2=1 on line 148 is applied through pass gate FET 162 to node 170 to turn off FET 192. Consequently, the logic "0" at node 110 is not affected by the high level at node 170. The low level at the input of inverter 180 causes inverter 180 to drive node 170 high, thereby reinforcing the logic "1" already at node 170. Consequently, logic values "0" and "1" are respectively at nodes 110 and 170 of latch 106 while pass gate FETs 160 and 162 are on.

When pass gate FETs 160 and 162 turn off in response to a low voltage on line 168, the voltage at node 110 does not float, even though node 110 is decoupled from line 146. Floating of node 110 is prevented because the output of inverter 180 is connected to the $+V_{DD}$ power supply voltage through the low source drain impedance of the P-channel FET (not shown) of inverter 180. The $+V_{DD}$ voltage at the output of inverter 180 is applied to the gate electrode of FET 192 to keep the source drain impedance of FET 192 low so terminal 188 and node 110 are substantially at ground potential. As a result, node 110 and line 120 are latched to a low level while node 170 is latched to a high level. Logic values "0" and "1" are respectively latched at nodes 172 and 112 of latch 108, as described supra in connection with the description of latch 106 in response to EV1=1, EV2=0.

Assume next that MB=1 is applied to mask cell 104. In response to MB=1, EV1=0 and EV2=0 are concurrently written to and stored by memory cell 104 when word line 168 is pulsed high to open pass gate FETs 160 and 162. Pulsing word line 168 high during a write operation causes line 146 to apply a logic "0" to node 110 thus disabling the inverting operation of inverter 184 since inverter 198 applies a low level to the gate electrode of FET 184. While pass gate FET 162 is enabled, an indeterminate voltage is produced at node 170 because the low EV2=0 voltage that line 146 applies to node 170 "fights" with a high voltage that inverter 180 supplies to node 170. This "fight" occurs because the EV1=0 encoder output on line 146 causes inverter 180 to apply a high voltage to node 170.

The voltage at node 170 thus resides somewhere between a logic low and a logic high at a voltage dependent primarily on the drive capacity of the output of encoder 140 on line 148 and the drive capacity of inverter 180. However, as soon as word line 168 goes low after completing the write cycle, the "fight" between encoder 146 and inverter 180 ceases because FETs 160 and 162 turn off, so nodes 110 and 170 are decoupled from lines 146 and 148. The high $+V_{DD}$ voltage at node 170 and the output of inverter 180 persists because of the connection of the turned on P-channel FET of inverter 180 to +$V_{DD}$. The high voltage at node 170 turns on FET 192 so terminal 188 and node 110 are at the low voltage. Consequently, after completion of the write cycle, logic values "0" and "1" are respectively stored at nodes 110 and 170 of latch 106.

Latch 108 responds to EV1=0, EV2=0 the same way that latch 106 responds to these values, so logic values "1" and "0" are respectively latched at nodes 172 and 112 of latch 108. Consequently, nodes 110 and 112, as well as lines 120 and 122, are all latched to a low voltage after the write operation has been completed so that cell 110 stores the encoded bits EV1=0, EV2=0.

Encoded data can also be written to memory cell 104 using a second write port coupled with cell 104. The second write port includes a word line 200 and pass gates 202, 204, 206, and 208, all configured and coupled with memory cell 104 in a similar fashion to the circuits of the first write port, described above. An additional encoder, not shown, can provide encoded bits to data lines 210 and 212 associated with the second write port or data lines 210 and 212 can respond to complementary bits that are not encoded.

Matching circuit 128 and the operation thereof during a look up operation of CAM cell 100 are now described in detail. Matching circuit 128 includes first and second pairs of N-channel FETs 230, 232 and 234, 236 for discharging associated match output line 132 during an unmasked CAM look up operation if a mismatch occurs between a data bit DB on line 142, as stored in cell 104, and reference bit RBA. The source-drain paths of FETs 230 and 232 are connected in series with each other, between match line 132 and ground. FETs 234 and 236 are similarly connected. The gates of FETs 230 and 234 are respectively connected to nodes 110 and 112 of cell 104 via data lines 120 and 122.

A match line precharge circuit includes precharge transistor 238 for pre-charging match line 132 prior to a CAM look up operation. P-channel FET 238 includes a source-drain path connected between +$V_{DD}$ power supply rail 194 and match line 132. FET 238 is turned on and off during respective low and high voltage level half cycles of clock wave CLK applied to the gate electrode of FET 238. Prior to a CAM look up operation, FET 238 is turned on during a low voltage half cycle of clock wave CLK, thus precharging match line 132 to nearly +$V_{DD}$.

Reference bit generating circuit 240 supplies complementary reference bits RB1 and RB2 to matching circuit 128 during the high voltage clock half cycle. FETs 230–236 of matching circuit 128 compare the reference bits to the latched bits on lines 120 and 122. Reference bit generating circuit 240 includes first and second inputs respectively responsive to reference bit RBA and clock wave CLK. Reference circuit 240 includes first and second AND gates, each having a first input directly responsive to CLK and a second input responsive directly to RBA and an inverted replica of RBA. The first and second AND gates respectively have outputs 242 and 244 for deriving complementary reference bits RB1 and RB2. The gate electrodes of matching circuit FETs 232 and 236 are respectively connected to be responsive to reference circuit outputs 244 and 242.

During high voltage half cycles of clock wave CLK following the clock low voltage half cycle which resulted in precharging line 238, reference circuit 240 derives complementary reference data values RB1 and RB2 representing reference bit RBA. Namely, if RBA="1", then RB1="1" and RB2="0"; if RBA="0", RB1="0" and RB2="1". During low voltage half cycles of clock wave CLK, reference circuit 240 drives both values RB1 and RB2 to low logic levels to turn off FETs 232 and 236 to avoid triggering a false discharge of match line 132.

A CAM look up operation occurs during high voltage half cycles of clock wave CLK because during these half cycles, match line 132 has been precharged to nearly +$V_{DD}$ and circuit 240 supplies to matching circuit 128 complementary reference values RB1 and RB2 representing the value of reference bit RBA. Match line 132 is discharged to a low logic level if FETs 230 and 232 are concurrently turned on by high logic levels applied to the gate electrodes thereof. In other words, match line 132 is discharged while RB2 and the voltage on line 120 are both high, or while RB1 and the voltage on line 122 are both high.

Accordingly, if the voltages on lines 120 and 122 are both low because cell 104 is masked, as occurs when EV1=0, match line 132 cannot be discharged to indicate a mismatch between reference bit RB and data bit DB. This is because the low voltages on lines 120 and 122 turn off FETs 230 and 234 to prevent discharge of the +$V_{DD}$ voltage on line 132, regardless of the values of RB1 and RB2.

When MB=0, cell 104 is not masked and matching circuit 128 responds to reference bit RBA and the data bit DB as encoded into bits EV1 and EV2, as stored in cell 104. Under this circumstance, circuit 128 functions as an exclusive-nor (XNOR) gate to compare the bi-level voltages on lines 120 and 122 with RB1 and RB2, in accordance with the following truth table.

TABLE II

| DB | EV1 on 120 | EV2 on 122 | RBA | RB1 | RB2 | match line result |
|---|---|---|---|---|---|---|
| 0 | 0 | 1 | 0 | 0 | 1 | 1 |
| 0 | 0 | 1 | 1 | 1 | 0 | 0 |
| 1 | 1 | 0 | 0 | 0 | 1 | 0 |
| 1 | 1 | 0 | 1 | 1 | 0 | 1 |

From TABLE II, line 132 has a high voltage when the data bit DB on line 142, as stored in encoded form in cell 104, is the same as the reference bit RBA. This action occurs because the low voltage on line 120 turns off FET 230 while the low value of RB1 turns off FET 236, or the low value of RB2 turns off FET 232 while the low voltage on line 122 turns off FET 234. Line 132 has a low voltage when the data bit on line 142, as stored in encoded form in cell 104, differs from the reference bit because the high voltage on line 120 turns on FET 230 while the high value of RB2 turns on FET 232, or the high value of RB1 turns on FET 236 while the high voltage on line 122 turns on FET 234.

Dual port CAM cell 100 includes first and second identical read ports 124 and 126 which are operative when the cell is being read in a non-associative manner. Hence, the following description of read port 124 suffices for read port 126. Read port 124 includes first and second read lines 250 and 252 for respectively receiving logic values indicative of the voltages on lines 120 and 122 during high voltage half cycles of clock wave CLK on read dump line 254. Read port 124 includes a first pair of N-charnel FETs 256, 258 having gate electrodes connected respectively to line 120 and read dump line 254, and source-drain paths connected in series between read line 250 and ground. A second pair of FETs 260, 262 has the respective gate electrodes thereof connected to line 122 and read dump line 254, and the source-drain paths thereof connected in series between read line 252 and ground. Read lines 250 and 252, like match line 132, are precharged to +$V_{DD}$ during the CLK low voltage half cycle through the source drain path of P-channel FET 263. While read dump line 254 has a high voltage during a read operation, a high logic value on one of lines 120 or 122 applied respectively to the gate of FET 256 or FET 260 discharges associated data read line 250 or 252. Consequently, when cell 104 is not masked (i.e., MB=0), the voltages on lines 250 and 252 are respectively complementary to the voltages on lines 120 and 122 and, therefore, have binary values that are respectively the same as and the complement of data bit DB. However, when MB=1, cell 104 is masked and the resulting low logic levels of EV1 and EV2, as coupled to lines 120 and 122, turn off FETs 256 and 260 to prevent discharging read lines 250 and 252. Accordingly, masking cell 104 masks both read circuits 124, 126 as well as matching circuits 128, 130.

Figure 3:
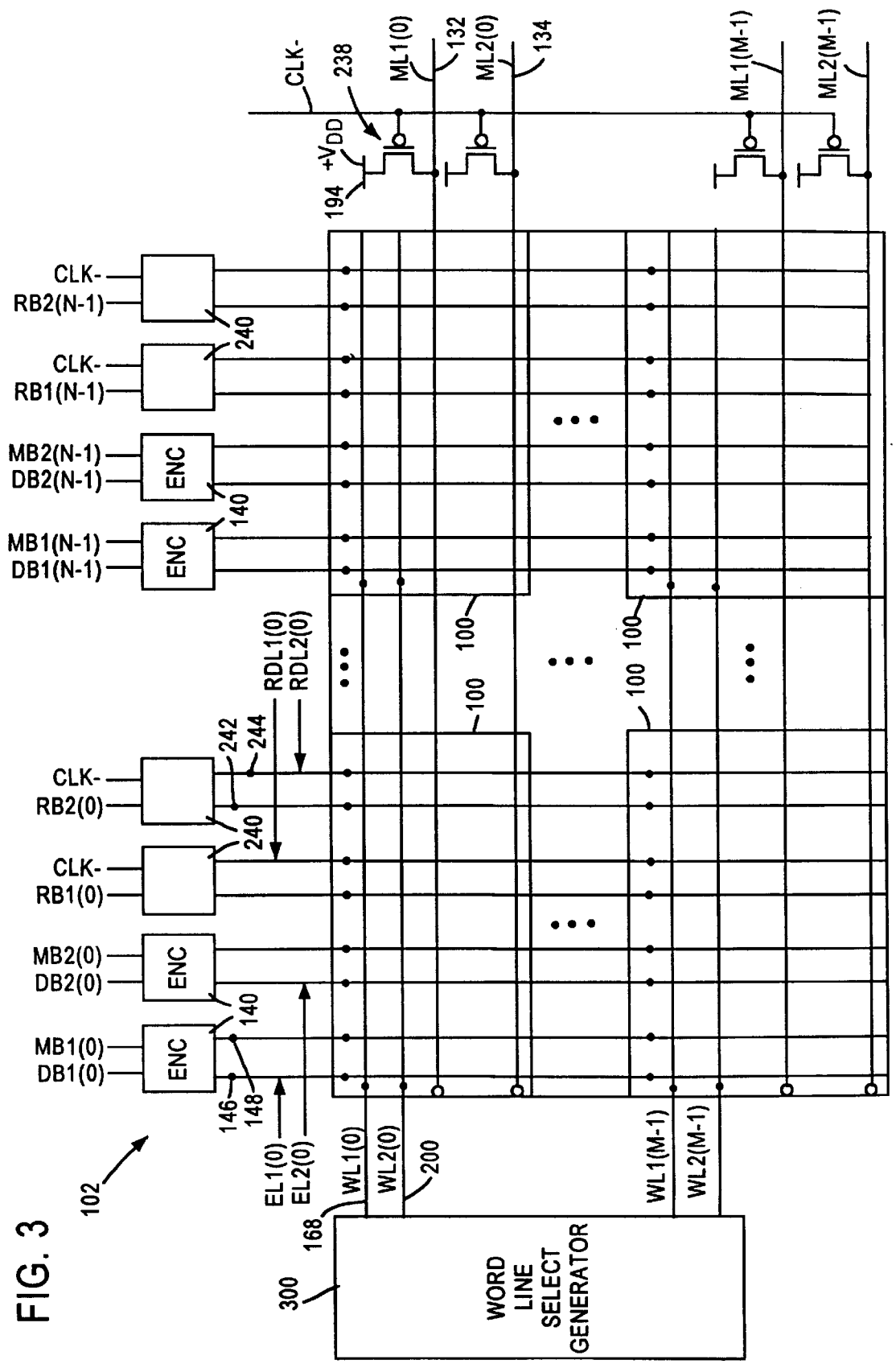
FIG. 3 is a circuit diagram of a CAM array including the CAM cell of FIG. 2.

With reference to FIG. 3, dual port CAM array 102 includes an array of dual port CAM cells 100 arranged in a matrix of M rows and N columns. The cells in each row of the array are connected to respond to voltages on a respective pair of word lines, such as WL1(0) and WL2(0), or WL1(M-1) and WL2(M-1). The cells in each column are also connected to drive a respective pair of match lines, such as ML1(0) and ML2(0), or ML1(N-1) and ML2(N-1).

The cells in each column are connected to respond to voltages on respective first and second pairs of encoded lines, such as EL1(0) and EL2(0). Each pair of encoded lines carries first and second encoded values, e.g., EV1 and EV2, supplied to the pair of encoded lines by a respective encoder 140. The cells in each column are also connected to respond to voltages on respective first and second pairs of reference data lines, such as RDL1(0) and RDL2(0). Each pair of reference data lines carries reference data values, e.g., RB1 and RB2, supplied to the pair of reference data lines by a respective reference data generator 240.

Each respective encoder 140 receives a data bit and a mask bit, e.g., DB1(0) and MB1(0), on respective input lines of the encoder. Similarly, each respective reference generator receives a reference bit and clock wave, e.g., RB1(0) and CLK, on respective input lines of the encoder.

Although omitted from FIG. 3 for the sake of clarity, it is to be understood that the cells in each row of the array are also connected to respond to the voltages on a respective pair of read dump lines, while the cells of each column are connected to drive respective first and second pairs of read data lines for reading data stored by the cells.

While there has been described and illustrated one embodiment of the invention, it will be clear that variations in the details of the embodiment specifically described may be made without departing from the trnle spirit and scope of the invention as defined in the following claims.

I claim:

1. A memory adapted to be responsive to mask and data bit sources comprising a plurality of selectively maskable memory cells, circuitry connected for combining the mask and data bits derived by said sources to derive plural encoded bits having values such that (i) a first combination of the plural encoded bits indicates a first data value and that a cell for storing the encoded bits is not to be masked, (ii) a second combination of the plural encoded bits indicates a second data value and that a cell for storing the encoded bits is not to be masked, and (iii) a third combination of the plural encoded bits indicates a cell for storing the encoded bits is to be masked, each of the selectively maskable memory cells having connections for enabling the cell to be responsive to and store the plural encoded bits associated with that cell as derived by the combining circuitry, each of the maskable cells including output circuitry connected to be responsive to the combination of bits stored in the cell for (a) performing readout associated with the first and second combination of values, and (b) preventing readout of the cell in response to the third combination of values.

2. The memory of claim 1, wherein at least some of the maskable memory cells are content addressable cells, each of the content addressable cells including a matching circuit connected to be responsive to the combination of bits stored in the cell and a reference bit for comparing the reference bit with the bits stored in the cell while the first and second combination of bits is stored in the cell, the results of the comparison driving the output circuitry of the cell.

3. The memory of claim 2, wherein at least some of the memory cells include circuitry for reading the contents of the cell, the circuitry for reading the contents of the cell being arranged so that (a) any cell storing the first combination of values supplies the output circuitry with the first data value, (b) any cells storing the second combination of values supplies the output circuitry with the second value, and (c) any cell storing the third combination of values supplies no data value to the output circuitry.

4. The memory of claim 1, wherein at least some of the memory cells include circuitry for reading the contents of the cell, the circuitry for reading the contents of the cell being arranged so that (a) any cell storing the first combination of values supplies the output circuitry with the first data value, (b) any cells storing the second combination of values supplies the output circuitry with the second value, and (c) any cell storing the third combination of values supplies no data value to the output circuitry.

5. The memory of claim 1, wherein each of the combinations includes first and second encoded bits, each of the cells having circuitry arranged to have three stable storage states for storing the first, second and third combinations of the first and second encoded bits.

6. The memory of claim 5, wherein the circuitry arranged to have three stable states includes first and second latches, each of the latches having first and second storage nodes, the first and second storage nodes of the first latch being respectively connected to be responsive to the first and second encoded bits during a write operation of the cell, the first and second nodes of the second latch being respectively connected to be responsive to the second and first encoded bits during the write operation, each of the latches including substantially identical circuitry including (a) first and second inverters selectively connected in a regenerative back-to-back relation between the first and second nodes, and (b) a control circuit responsive to the bit at one of the nodes for controlling the connections of the inverters to each other.

7. The memory of claim 6, wherein the first inverter has an input connected to the first node and an output connected to the second node, the second inverter selectively being connected for supplying the first node with an inverted replica of voltage at the second node, the control circuit being connected to be responsive to the voltage at the first node for controlling activation of the second inverter.

8. The memory of claim 7, wherein the first and second bits have the same value in the third combination, the control circuit and the first and second inverters being connected and arranged so that the control circuit disables the second inverter in response to the first and second bits having the values for the third combination to cause a first voltage associated with the value of the first bit in the third combination to be supplied to and maintained at the first node and a voltage between the voltage levels of the bits for the third combination to be at the second node during the write operation, and to cause the first voltage to remain at the first node after the write operation for the third combination has been concluded until the next write operation for the cell occurs.

9. The memory of claim 8, wherein the control circuit and the first and second inverters are arranged so that the second node is driven to a second voltage level after the write operation for the third combination has been concluded until the next write operation for the cell occurs.

10. The memory of claim 9, wherein the first and second bits respectively have first and second different values in the first combination, the control circuit and the first and second inverters being connected and arranged so that in response to the first and second bits having the values for the first combination the first and second inverters are enabled so the first and second different values are respectively supplied to and maintained at the first and second nodes during the write operation for the first combination and after the write operation for the first combination has been concluded until the next write operation for the cell occurs.

11. The memory of claim 10, wherein the first and second bits respectively have the second and first values in the second combination, the control circuit and the first and second inverters being connected and arranged so that in response to the first and second bits having the values for the second combination the second inverter is disabled so the second and first different values are respectively supplied to and maintained at the first and second nodes during the write operation for the second combination and after the write operation for the second combination has been concluded until the next write operation for the cell occurs.

12. The memory of claim 11, wherein the second inverter includes an element that is connected to be responsive to the voltage at the second node so that the element is switched to a low impedance state and connected to supply the second voltage to the first node in response to the first voltage being at the second node.

13. The memory of claim 5, wherein the circuitry arranged to have three stable states includes first and second latches, each of the latches having first and second storage nodes, the first and second nodes of the first latch being respectively connected to be responsive to the first and second encoded bits during a write operation of the cell, the first and second nodes of the second latch being respectively connected to be responsive to the second and first encoded bits during the write operation, each of the latches including substantially identical circuitry including first and second inverters selectively connected in a regenerative back-to-back relation between the first and second nodes.

14. The memory of claim 13, wherein the first and second bits have the same value in the third combination, the first and second inverters being connected and arranged so that the second inverter is disabled in response to the first and second bits having the values for the third combination to cause the first voltage associated with the value of the first bit in the third combination to be supplied to and maintained at the first node and a voltage between first and second voltage levels of the bits for the third combination at the second node during the write operation and to cause the first voltage to remain at the first node after the write operation for the third combination has been concluded until the next write operation for the cell occurs.

15. The memory of claim 14, wherein the first and second inverters are arranged so that the second node is driven to the second voltage level after the write operation for the third combination has been concluded until the next write operation for the cell occurs.

16. The memory of claim 13, wherein the first and second bits respectively have first and second different values in the first combination, the first and second inverters being connected and arranged so that in response to the first and second bits having the values for the first combination the first and second inverters are enabled so the first and second different values are respectively supplied to and maintained at the first and second nodes during the write operation for the first combination and first and second nodes and after the write operation for the third combination has been concluded until the next write operation for the cell occurs.

17. The memory of claim 16, wherein the first and second bits respectively have the second and first values in the second combination, the control circuit and the first and second inverters being connected and arranged so that in response to the first and second bits having the values for the second combination the second inverter is disabled so the second and first different values are respectively supplied to and maintained at the first and second nodes during the write operation for the second combination and after the write operation for the second combination has been concluded until the next write operation for the cell occurs.

18. The memory of claim 17, wherein the second inverter includes an element that is connected to be responsive to the voltage at the second node so that the element is switched to a low impedance state and connected to supply the second voltage to the first node in response to the first voltage being at the second node.

19. The memory of claim 5, wherein the first and second bits respectively have the second and first values in the second combination, the control circuit and the first and second inverters being connected and arranged so that in response to the first and second bits having the values for the second combination the second inverter is disabled so the second and first different values are respectively supplied to and maintained at the first and second nodes during the write operation for the second combination and after the write operation for the second combination has been concluded until the next write operation for the cell occurs.

20. The memory of claim 19, wherein the second inverter includes an element that is connected to be responsive to the voltage at the second node so that the element is switched to a low impedance state and connected to supply the second voltage to the first node in response to the first voltage being at the second node.

21. The memory of claim 1, wherein at least some of the cells are dual port CAM cells, each of the CAM cells including (a) a pair of latches having first and second storage nodes connected to drive first and second storage lines with three combinations of bi-level voltages commensurate with the values of the encoded bits stored in the cell, (b) first and second read circuits respectively connected to first and second read lines and both connected to the first and second storage lines, and (c) first and second match circuits respectively connected to first and second complementary reference lines and both connected to the first and second storage lines.

22. A method of operating a memory including memory cells comprising combining a data bit and a mask bit to derive plural encoded bits having combinations of values such that the plural encoded bits have (a) a first combination of values when a cell of the memory is to store a data bit having a first value, (b) a second combination of values when the cell is to store a data bit having the second value, and (c) a third combination of values when the cell is to be masked; storing the encoded bits in one of the cells at different times; and selectively coupling the encoded bits stored in the one cell to readout circuitry of the memory so that the readout circuitry responds to the first and second combinations of stored bits and is unresponsive to the third combination of stored bits.

23. The method of claim 22, wherein the cell is a CAM cell responsive to a reference bit, flirther comprising comparing the values of the stored first and second combinations of bits with the reference bit, the comparing step causing the readout circuitry to derive first and second output levels in response to the reference bit and the data bit which was encoded being respectively different and the same.

24. The method of claim 23, wherein the cell is a CAM cell responsive to a reference bit, further comprising comparing the values of the stored combination of bits with the reference bit, the comparing step causing the readout circuitry to derive first and second output levels in response to the reference bit and the data bit which was encoded being respectively different and the same, the first level differing from a level the readout circuitry usually derives, the second level having the same as the level the readout circuitry usually derives, and responding to the third stored combination of bits to cause the readout circuitry to derive the second level.

25. The method of claim 22, further including applying a read address input to the cell, responding to the read address input to the cell to cause the cell to supply the stored bits in the cell to the readout circuitry so that the readout circuitry derives (a) first and second levels that respectively are the same as the levels of the data bit which resulted in the encoded bits stored in the cell when the cell stores the first and second combinations of bit values, and (b) the second level when the cell stores the third combination of bit values.

26. The method of claim 22, further including applying a read address input to the cell, responding to the read address input to the cell to cause the cell to supply the stored bits in the cell to the readout circuitry so that the readout circuitry derives first and second levels that respectively are the same as the levels of the data bit which resulted in the encoded bits stored in the cell when the cell stores the first and second combinations of bit values.

* * * * *

UNITED STATES PATENT AND TRADEMARK OFFICE
CERTIFICATE OF CORRECTION

PATENT NO.    : 6,163,473
DATED         : December 19, 2000
INVENTOR(S)   : David P. Hannum It is certified that error appears in the above-identified patent and that said Letters Patent is hereby corrected as shown below:

Column 2,
Line 8, delete "DUMP 1" and insert therefore -- DUMP 1 --

Column 3,
Line 8, delete "d(Lischarges" and insert therefore -- discharges --

Column 4,
Line 7, delete "tunr" and insert therefore -- turn --

Column 5,
Line 23, delete "lines.," and insert therefore -- lines, --

Column 6,
Line 33, delete "duial" and insert therefore -- dual --
Line 56, delete "pail" and insert therefore -- pair --

Column 7,
Line 4, delete "flnctions" and insert therefore -- functions --
Line 41, delete "amd" and insert therefore -- and --
Line 47, delete "umnnasked" and insert therefore -- unmasked --

Column 9,
Line 14, before "line 146" insert -- (1) --
Line 27, delete "enabled-" and insert therefore -- enabled --
Line 42, delete "manier" and insert therefore -- manner --
Line 64, delete "and166" and insert therefore -- and 166 --

UNITED STATES PATENT AND TRADEMARK OFFICE
CERTIFICATE OF CORRECTION

PATENT NO.   : 6,163,473
DATED        : December 19, 2000
INVENTOR(S)  : David P. Hannum It is certified that error appears in the above-identified patent and that said Letters Patent is hereby corrected as shown below:

Column 12,
Line 58, delete "N-charmel" and insert therefore -- N-channel --

Signed and Sealed this

Nineteenth Day of November, 2002

Attest:

Attesting Officer

JAMES E. ROGAN
Director of the United States Patent and Trademark Office